(12) United States Patent
Pagnozzi

(10) Patent No.: US 6,396,691 B1
(45) Date of Patent: May 28, 2002

(54) THERMAL COVER FOR T1/HDSL REPEATER CASE

(75) Inventor: Ernest Pagnozzi, Bayonet Point, FL (US)

(73) Assignee: Circa telecom, USA, Inc., Hudson, FL (US)

( * ) Notice: Subject to any disclaimer, the term of this patent is extended or adjusted under 35 U.S.C. 154(b) by 0 days.

(21) Appl. No.: 09/550,619

(22) Filed: Apr. 17, 2000

(51) Int. Cl.[7] .................................................. H05K 7/20
(52) U.S. Cl. .................... 361/690; 174/17.05; 174/52.3; 361/704; 361/715
(58) Field of Search ............................. 174/17.05, 52.3, 174/705, 16.3; 361/688, 690–692, 694–695, 701, 704–705, 707–708, 710, 715, 730, 752, 796

(56) References Cited

U.S. PATENT DOCUMENTS 5,065,278 A * 11/1991 Schultz ........................ 361/690
5,896,268 A * 4/1999 Beavers ....................... 361/690
6,118,662 A * 9/2000 Hutchison et al. .......... 361/704

* cited by examiner

*Primary Examiner*—Gregory Thompson
(74) *Attorney, Agent, or Firm*—Stanley M. Miller

(57) ABSTRACT

A repeater case capable of housing HDSL telecommunications modules without an excessive buildup of heat. The repeater case has a base, an open-topped housing, and a closure member that closes the housing. The closure member is provided in the form of a pair of thermal covers that share a common construction, including heat-radiating fins formed on their respective top walls and heat transferring structures positioned on the respective interior sides of their top walls. The housing includes multiple printed circuit boards to further enhance internal air flow, each of which is protected from short circuits by an acrylic plastic barrier mounted in vertically spaced apart relation from it. The spacing between each printed circuit board and its barrier provides ample space for the connection of individual conductors from a stub cable that enters the repeater case through an opening formed in the base. The spacing also enhances the air flow within the repeater case.

15 Claims, 3 Drawing Sheets

THERMAL COVER FOR T1/HDSL REPEATER CASE

BACKGROUND OF THE INVENTION

1. Field of the Invention

This invention relates, generally, to a repeater case construction that prevents overheating of the repeater case.

2. Description of the Prior Art

Repeater cases hold sensitive telecommunications equipment in hostile environments such as telephone poles exposed to the weather, manholes, and the like. A typical repeater case has twenty-four slots and is designed to hold twenty-four T1 telecommunication line modules.

Repeater cases designed to hold T1 line cards work well when performing that function. However, when High Density Subscriber Line (HDSL) modules are mounted in such repeater cases, overheating occurs because the cases are not designed to dissipate the heat generated by such modules. The HDSL modules are also larger in some cases than the T1 modules, and in some cases an HDSL module occupies only ever other slot in a repeater case.

The number of HDSL modules that may be fitted into a repeater case designed to hold T1 modules is limited not only by the larger size in some cases of the HDSL modules, but also by the fact that the HDSL modules generate more heat than T1 modules.

The known repeater cases also include acrylic plastic barriers that prevent accidental short circuits between printed circuit (PC) boards in the repeater case housing and individual conductors. The conductors pass through small openings formed in the acrylic plastic barriers and their respective free ends are hard-wired to the bottoms of such PC boards. The small openings formed in the acrylic plastic barriers make it somewhat difficult to connect the individual conductors to the PC boards, and the barriers themselves restrict air flow and thus contribute to heat build-up within the repeater case.

The repeater cases heretofore known also house a large PC board having opposing edges that are attached to opposite walls of the housing and which therefore inhibits air flow within the housing.

What is needed, then, is an improved repeater case construction. The needed repeater case would handle both T1 and HDSL modules in the absence of excessive heat buildup. It would also accommodate eighteen or more HDSL modules. It would provide enhanced clearance between the acrylic plastic barriers and the conductors. Moreover, it would provide better air flow around the PC board.

However, in view of the prior art taken as a whole at the time the present invention was made, it was not obvious to those of ordinary skill in this art how the needed repeater case could be provided.

SUMMARY OF THE INVENTION

The long-standing but heretofore unfulfilled need for an improved repeater case that overcomes the limitations of the prior art is now met by a new, useful, and nonobvious invention. The novel repeater case of this invention includes a base, a housing that surmounts the base, and a highly novel closure means that surmounts and closes the housing.

More particularly, the base has a bottom wall, upstanding side walls, and an open top. The housing has side walls, an open bottom and an open top; the base supports the housing and closes the open bottom of the housing.

The closure means that closes the open top of the housing is adapted to transfer heat within the base and housing to an environment external to the repeater case.

More specifically, the closure means is provided in the form of two thermal covers, each of which has a construction in common with the other.

The closure means further includes a plurality of heat-radiating fins formed in a top wall thereof.

A slot is formed in a top wall of the closure means and a heat transfer bar is disposed within the slot. A support bar is disposed adjacent an interior side of the top wall, and means are provided for interconnecting the heat transfer bar and the support bar.

Accordingly, heat within the housing rises to the top wall of the closure means, contacts the support bar and is transferred from the support bar to the heat transfer bar and to the heat-radiating fins.

A potting compound having a high coefficient of heat transfer is disposed between the support bar and the interior side of the top wall.

The closure means has a deep design to increase the volumetric capacity of the repeater case, thereby increasing the amount of heat that it can tolerate.

A plurality of sets of electrical connectors is positioned within the housing, each set of which is adapted to hold a telecommunications module. All of the telecommunications modules adapted to hold both HDSL and T1 modules.

A plurality of printed circuit boards are housed within the housing, there being one printed circuit board for each of the modules.

An opening is formed in the base for receiving a telecommunications cable. The telecommunications cable is divided into a plurality of sets of conductors, and each set of conductors is connected to a corresponding PC board.

A mounting means is provided for mounting a plurality of nonconductive barriers within the housing in vertically spaced apart relation to the PC boards, there being as many nonconductive barriers as there are PC boards. The nonconductive barriers, preferably formed of acrylic plastic, serve to prevent short circuits between the conductors and the PC boards.

The invention can also be defined as a method for cooling high density subscriber line modules in a repeater case, including the steps of providing a closure means for the repeater case and pressurizing an internal volume of the repeater case with a cooling atmosphere in the form of a gaseous fluid. Further steps include the steps of forming heat-radiating fins on an external surface of the closure means, positioning materials having a high coefficient of heat transfer in contact with an interior surface of the closure means and placing the materials in heat conducting relation to the heat radiating fins through an opening formed in the closure means.

The steps of the novel method further include the step of providing multiple printed circuit boards within the repeater case in spaced apart relation to one another, each of the printed circuit boards being dedicated to an associated module so that the spacing between the printed circuit boards enhances the cooling effect of the cooling atmosphere.

Additional method steps include positioning an electrically insulating barrier means in spaced apart relation to each of the printed circuit boards to facilitate connection of conductors to the printed circuit boards and to enhance the cooling effect of the cooling atmosphere, and forming the closure means so that it has a deep construction to increase its volumetric capacity for dissipating heat.

It is therefore understood that it is an important object of this invention to provide a repeater case capable of housing HDSL modules and dissipating the heat generated thereby.

A more specific object is to provide a repeater case having thermal covers that dissipate heat.

Another more specific object is to provide a repeater case having improved air flow therewithin.

Still another object is to provide a repeater case having acrylic plastic barriers that provide enhanced clearance for conductors as well as enhanced air flow.

Another object is to improve air flow within a repeater case by providing a design where the PC board of the prior art is divided into a number of smaller PC boards to further enhance the air flow within the repeater case.

These and other important objects, advantages, and features of the invention will become clear as this description proceeds.

The invention accordingly comprises the features of construction, combination of elements, and arrangement of parts that will be exemplified in the description set forth hereinafter and the scope of the invention will be set forth in the claims.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

Figure 1:
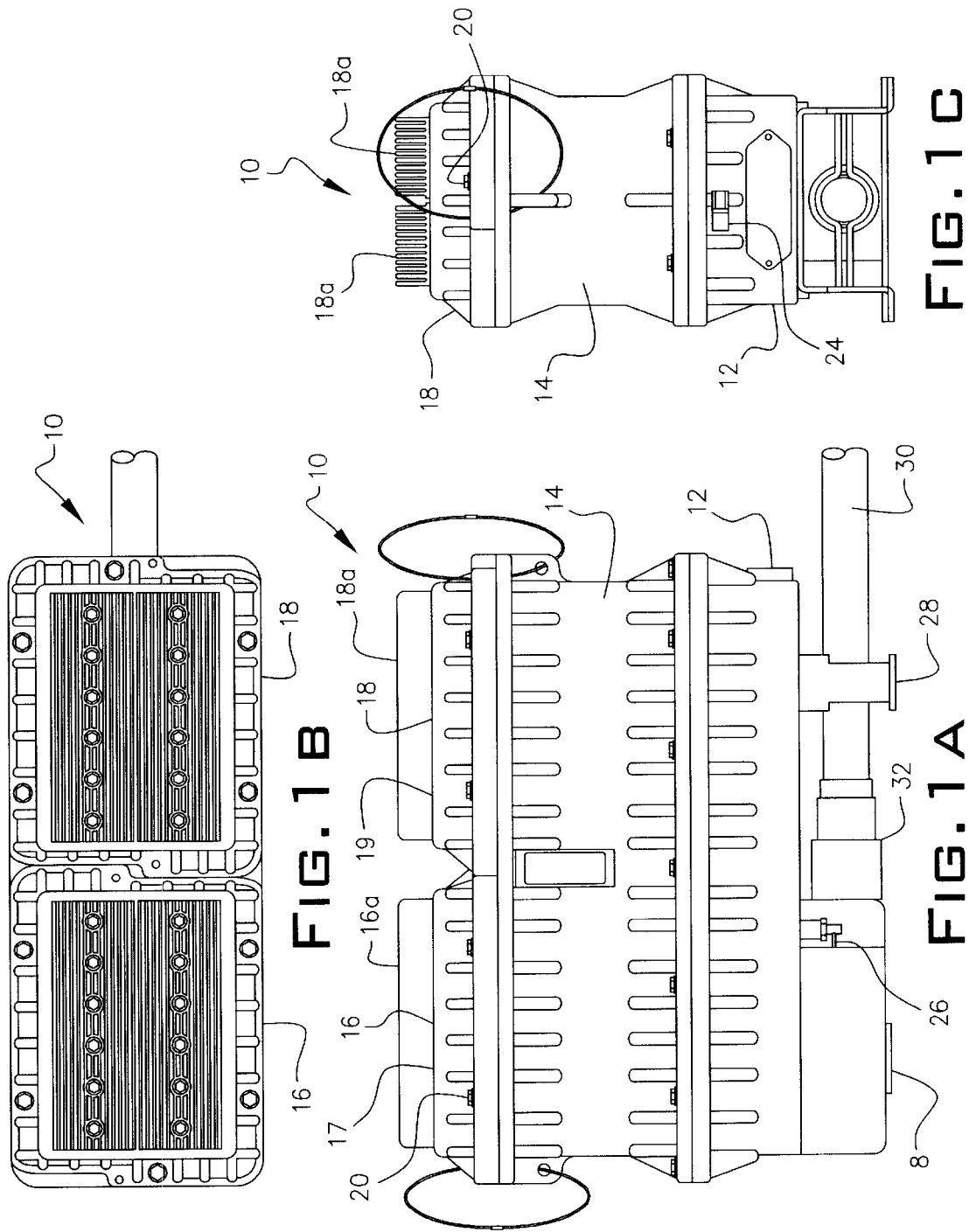
FIG. 1A is a side elevational view of the novel repeater housing.
FIG. 1B is a top plan view thereof.
FIG. 1C is an end elevational view thereof.

Referring now to FIGS. 1A, 1B, and 1C, it will there be seen that an illustrative embodiment of the invention is denoted as a whole by the reference numeral 10. Repeater case 10 includes molded base 12, housing 14, and thermal covers 16, 18 which collectively provide the closure means for open-topped housing 14. A plurality of torque bolts, collectively denoted 20, secure thermal covers 16, 18 to housing 14.

Base 12 and housing 14 are made of a fiberglass composite having low thermal conductivity. Thermal covers 16, 18 are preferably made of a material having a high coefficient of heat transfer, such as aluminum. The aluminum could be cast, billet, or forged. However, thermal covers 16, 18 could also be made of other materials such as a fiberglass composite, for example.

Figure 2:
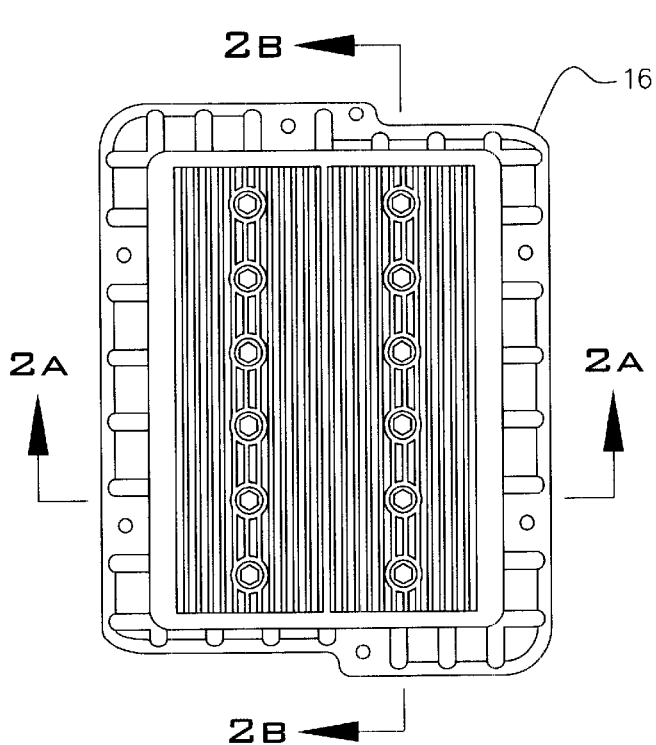
FIG. 2 is a top plan view of one thermal cover.
Figure 2B:
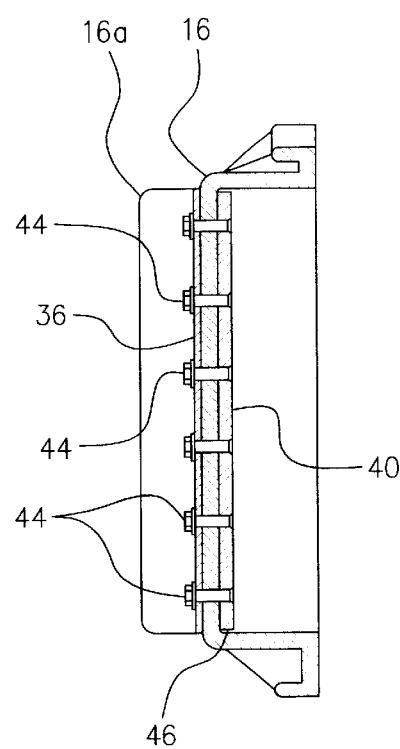
FIG. 2B is a longitudinal sectional view taken along line 2B—2B in FIG. 2.
Figure 2A:
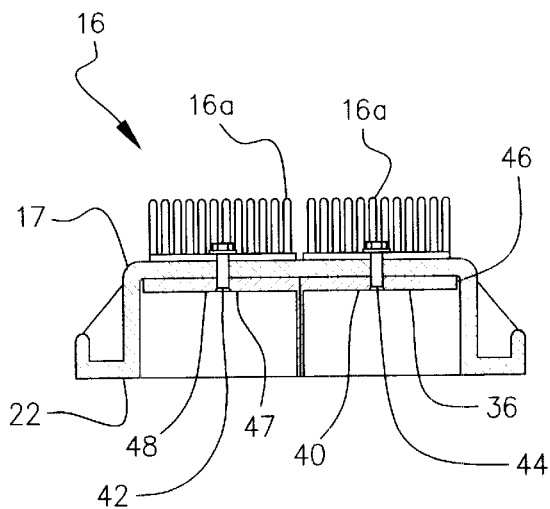
FIG. 2A is a transverse sectional view taken along line 2A—2A in FIG. 2.

As best understood in connection with FIGS. 2, 2A and 2B, thermal cover 16 defines a relatively large volume that serves as a heat dissipating plenum chamber. Thermal cover 18 has the same structure. This large volume results from the deep design of the thermal covers, i.e., the side walls thereof have an elongate vertical extent relative to shallow closure members.

Gasket 22 (FIG. 2A) provides an air-tight seal between thermal covers 16, 18 and the uppermost rim of housing 14. A similar gasket, not shown, provides an air-tight seal between base 12 and housing 14.

Heat-radiating fins 16A, 18A, also preferably formed of aluminum, are integrally formed with and surmount thermal covers 16, 18, respectively.

A gaseous fluid under pressure, such as air, relatively pure nitrogen, or other cooling gaseous fluid, is admitted into the sealed plenum chamber provided by the novel assembly through pressure relief valve 24 (FIG. 1C) or air bypass valve 26 (FIG. 1A), both of which are provided in base 12 of repeater case 10. Those of ordinary skill in this art will recognize that repeater case 10 is adapted from a T1 repeater case, styles 818–819, made by AT&T. Accordingly, it should also be understood that different valves may be used for the same purpose when adapting other repeater cases.

Mounting brackets such as mounting bracket 28 (FIG. 1A) facilitate mounting of repeater case 10 on a utility pole or manhole, but any suitable mounting brackets will suffice, it being understood that mounting brackets 8 and 28 form no part of the invention, per se.

Stub cable 30 enters base 12 at cable inlet 32 (FIG. 1A).

As depicted in FIGS. 2A and 2B, each thermal cover 16, 18 is designed to rapidly transfer heat from the pressurized space within housing 14. The novel structure of each thermal cover includes a pair of parallel, longitudinally disposed heat transfer bars 36, 47 each of which is positioned in a slot formed in top wall 17, 19 (see also FIG. 1A) of thermal covers 16, 18, respectively. Each heat transfer bar is connected to a longitudinally disposed support bar 40, 48 by a plurality of screws, collectively denoted 42, 44. Potting compound 46 having a high heat transfer efficiency is applied to the interior side of top walls 17, 19 prior to installation of support bars 40, 48.

Note that support bars 40, 48 together with potting compound 46, substantially cover the entire interior side of top wall 17, it being understood that a similar construction is provided in connection with top wall 19 as well. Accordingly, the support bars, the potting compound, and the heat transfer bars are designed to efficiently transfer heat from the pressurized confines of housing 14 to heat-radiating fins 16A, 18A.

Figure 3:
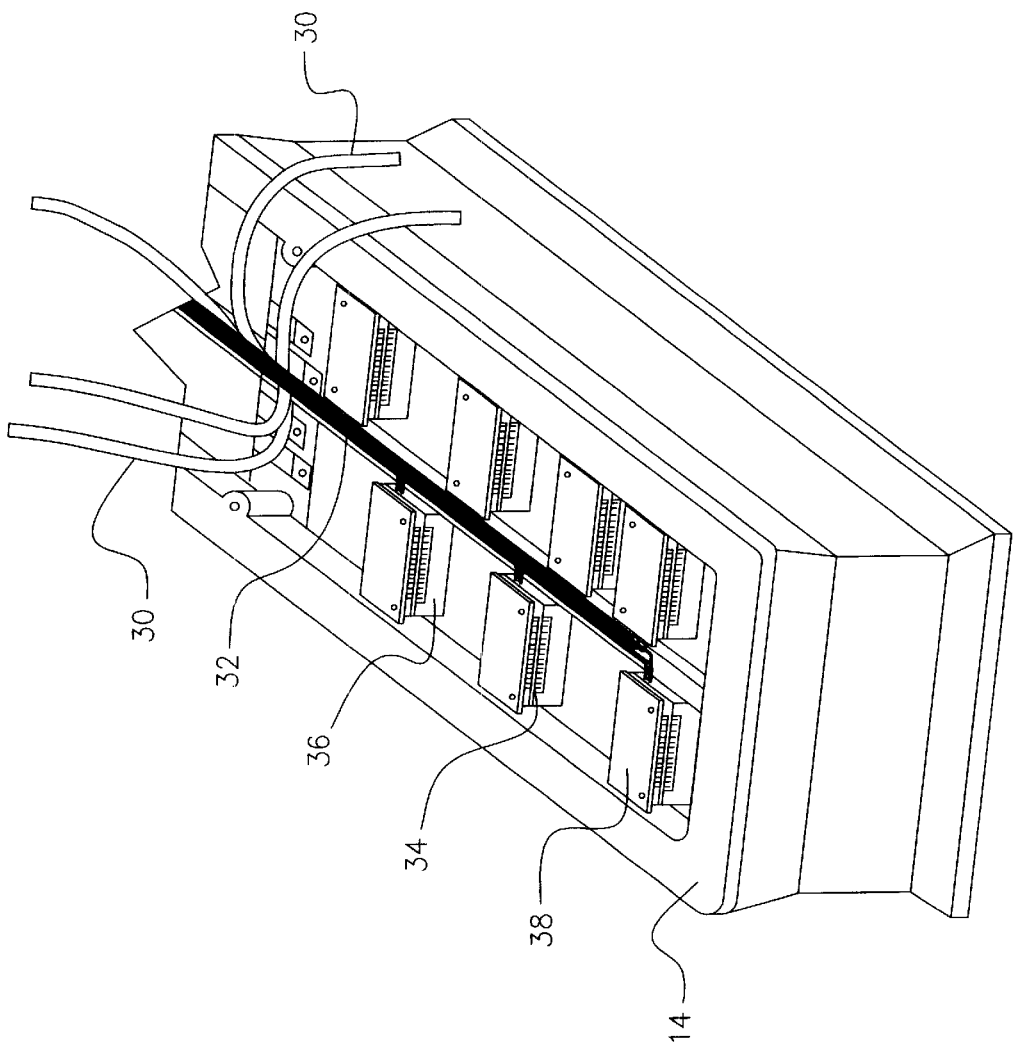
FIG. 3 is a perspective view depicting the interior of the novel repeater case housing when the base thereof has been removed.

Housing 14 is depicted with base 12 removed therefrom in FIG. 3. In FIG. 3, housing 14 is inverted from its FIG. 1A position so the view is from the bottom of said housing. Each stub cable 30 includes a large number of individual conductors 32 that are hard-wired to the respective bottoms of PC boards 34. Electrical connectors 36 are mounted to the top of said PC boards 34 and are adapted to receive both T1 and HDSL modules, not shown.

PC boards 34 are fixedly secured to the inside walls of housing 14 and said PC boards 34 therefore support connectors 36 and the T1 or HDSL modules.

A Plexiglas® acrylic plastic barrier 38 is positioned in parallel, spaced apart relation to each PC board 34. This spacing provides ample clearance for the passage of individual conductors 32 and thus facilitates their connection to the respective PC boards. The ample clearance also facilitates the flow of air from base 12 into housing 14.

PC boards 34 thus replace the conventional single piece PC board of the prior art. Since each PC board is spaced apart from its contiguous PC boards, the structure within housing 14 is open and heated air is therefore able to flow to the top of the housing for eventual dissipation through heat-radiating fins 16A, 16B. However, the single piece PC boards of the prior art could still be used in the novel structure, and both the novel mounting of acrylic plastic barriers 38 and the novel structure of the thermal covers 16, 18 would still provide a much cooler repeater casing.

The HDSL modules are preferably encased in metallic boxes to provide shielding from electromagnetic interference. The metal also serves as a good heat sink and heat conductor, transferring heat to the air flowing in the gaps between the modules.

The highly novel design of the thermal covers thus serves to dissipate heat from the repeater case, even when all connectors are occupied by HDSL modules. Moreover, the enhanced clearance provided by the acrylic plastic barriers and the provision of multiple PC boards also serve to enhance the air flow within the repeater housing and thus contribute to the cooling performance of the unit.

It will thus be seen that the objects set forth above and those made apparent by the foregoing description are efficiently attained. Since certain changes may be made in the above construction without departing from the scope of the invention, it is intended that al matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between.

Now that the invention has been described:
What is claimed is:

1. A repeater case, comprising:
   a base having-a bottom wall, upstanding side walls, and an open top;
   a housing having side walls, an open bottom and an open top, said base supporting said housing and closing said open bottom of said housing;
   a closure means for closing said open top of said housing;
   said closure means adapted to transfer heat within said base and housing to an environment external to said repeater case;
   said closure means including two thermal covers having a common construction with one another;
   a plurality of heat-radiating fins formed in a top wall of said closure means;
   a slot formed in a top wall of said closure means;
   a heat transfer bar disposed within said slot;
   a support bar disposed adjacent an interior side of said top wall; and
   means for interconnecting said heat transfer bar and said support bar;
   whereby heat within said housing rises to said top wall of said closure means, contacts said support bar and is transferred from said support bar to said heat transfer bar and to said heat-radiating fins.

2. The repeater case of claim 1, further comprising a potting compound having a high coefficient of heat transfer, said potting compound disposed between said support bar and said interior side of said top wall.

3. The repeater case of claim 1, wherein said closure means has a deep design to increase the volumetric capacity of said repeater case, thereby increasing the amount of heat that can be tolerated by said repeater case.

4. The repeater case of claim 1, further comprising a plurality of sets of electrical connectors positioned within said housing, each set of which is adapted to hold a telecommunications module.

5. The repeater case of claim 4, wherein at least one of said telecommunications modules is adapted to hold a HDSL module.

6. The repeater case of claim 4, wherein at least one of said telecommunications modules is adapted to hold a T1 module.

7. The repeater case of claim 4, further comprising a plurality of printed circuit boards housed within said housing, there being one printed circuit board for each of said modules.

8. The repeater case of claim 4, further comprising an opening formed in said base for receiving a telecommunications cable.

9. The repeater case of claim 8, wherein said telecommunications cable is divided into a plurality of sets of conductors, and wherein each set of conductors is connected to a corresponding PC board.

10. The repeater case of claim 9, further comprising mounting means for mounting a plurality of nonconductive barriers within said housing in vertically spaced apart relation to said PC boards, there being as many nonconductive barriers as there are PC boards, said nonconductive barriers serving to prevent short circuits between said conductors and said PC boards.

11. The repeater case of claim 10, wherein said nonconductive barriers are made of acrylic plastic.

12. A method for cooling high density subscriber line modules in a repeater case comprising the steps of:
   providing a closure means for said repeater case;
   pressurizing an internal volume of said repeater case with a cooling atmosphere in the form of a gaseous fluid;
   forming heat-radiating fins on an external surface of said closure means;
   positioning materials having a high coefficient of heat transfer in contact with an interior surface of said closure means; and
   placing said materials in heat conducting relation to said heat-radiating fins through an opening formed in said closure means.

13. The method of claim 12, further comprising the step of providing multiple printed circuit boards within said repeater case in spaced apart relation to one another, each of said printed circuit boards being dedicated to an associated module, whereby the spacing between said printed circuit boards enhances the cooling effect of said cooling atmosphere.

14. The method of claim 13, further comprising the step of positioning an electrically insulating barrier means in spaced apart relation to each of said printed circuit boards to facilitate connection of conductors to said printed circuit boards and to enhance the cooling effect of said cooling atmosphere.

15. The method of claim 14, further comprising the step of forming said closure means so that it has a deep construction to increase its volumetric capacity for dissipating heat.

* * * * *